(12) United States Patent
Oganesian et al.

(10) Patent No.: US 9,496,247 B2
(45) Date of Patent: Nov. 15, 2016

(54) INTEGRATED CAMERA MODULE AND METHOD OF MAKING SAME

(71) Applicant: Optiz, Inc., Palo Alto, CA (US)

(72) Inventors: Vage Oganesian, Sunnyvale, CA (US); Zhenhua Lu, East Palo Alto, CA (US)

(73) Assignee: Optiz, Inc., Palo Alto, CA (US)

( * ) Notice: Subject to any disclaimer, the term of this patent is extended or adjusted under 35 U.S.C. 154(b) by 0 days.

(21) Appl. No.: 14/463,896

(22) Filed: Aug. 20, 2014

(65) Prior Publication Data

US 2015/0054001 A1  Feb. 26, 2015

Related U.S. Application Data

(60) Provisional application No. 61/870,084, filed on Aug. 26, 2013.

(51) Int. Cl.
*H01L 31/12* (2006.01)
*H01L 31/14* (2006.01)
(Continued)

(52) U.S. Cl.
CPC .......... *H01L 25/167* (2013.01); *H04N 5/2256* (2013.01); *H04N 5/2257* (2013.01);
(Continued)

(58) Field of Classification Search
CPC ..................... H01L 31/10; H01L 31/12; H01L 31/14; H01L 31/141; H01L 31/143;
(Continued)

(56) References Cited

U.S. PATENT DOCUMENTS 5,340,993 A * 8/1994 Salina ................. H01L 31/0232
250/551
6,777,767 B2  8/2004 Badehi
(Continued)

FOREIGN PATENT DOCUMENTS

KR  10-0514917  9/2005

OTHER PUBLICATIONS

PCT Search Report and Written Opinion dated Dec. 2, 2014 corresponding to the related PCT Patent Application No. US14/52000.
(Continued)

*Primary Examiner* — William F Kraig
*Assistant Examiner* — Maliheh Malek
(74) *Attorney, Agent, or Firm* — DLA Piper LLP (US)

(57) ABSTRACT

A camera module and method of making same, includes a substrate of conductive silicon having top and bottom surfaces, a sensor device, and an LED device. The substrate includes a first cavity formed into the bottom surface of the substrate and has an upper surface, an aperture extending from the first cavity upper surface to the top surface of the substrate, and a second cavity formed into the top surface of the substrate and having a lower surface. The sensor device includes at least one photodetector, is disposed at least partially in the first cavity, and is mounted to the first cavity upper surface. The LED device includes at least one light emitting diode, is disposed at least partially in the second cavity, and is mounted to the second cavity lower surface.

34 Claims, 17 Drawing Sheets

(51) Int. Cl.
- *H01L 31/153* (2006.01)
- *H01L 25/16* (2006.01)
- *H04N 5/225* (2006.01)
- *H04N 5/232* (2006.01)
- *H04N 5/235* (2006.01)
- *H04N 13/02* (2006.01)
- *H01L 33/02* (2010.01)

(52) U.S. Cl.
CPC .......... *H04N 5/2258* (2013.01); *H04N 5/2355* (2013.01); *H04N 5/23232* (2013.01); *H04N 13/0239* (2013.01); *H04N 13/0253* (2013.01); *H01L 2224/48091* (2013.01); *H01L 2224/73265* (2013.01); *H01L 2924/181* (2013.01); *H01L 2924/18165* (2013.01)

(58) Field of Classification Search
CPC ................. H01L 31/145; H01L 31/147; H01L 31/153; H01L 31/16; H01L 31/162; H01L 31/165; H01L 31/167; H01L 31/173; H01L 33/00; H01L 33/02; H01L 33/48; H01L 33/483; H01L 33/52; H01L 31/102; H01L 31/02327; H01L 31/09; H01L 27/14625; H01L 27/14627; H01L 27/14629; H01L 27/146; H01L 27/14601; H01L 27/14618; H01L 27/14632; H01L 27/14634; H01L 27/14636; H01L 27/14638; H01L 27/14643; H01L 27/14645; H01L 27/14687; H04N 5/2256; H04N 5/2257; H04N 5/2258
See application file for complete search history.

(56) References Cited

U.S. PATENT DOCUMENTS

| | | | |
|---|---|---|---|
| 6,919,569 B2 | 7/2005 | Homme et al. | |
| 6,972,480 B2 | 12/2005 | Zilber et al. | |
| 7,033,664 B2 | 4/2006 | Zilber et al. | |
| 7,157,742 B2 | 1/2007 | Badehi | |
| 7,192,796 B2 | 3/2007 | Zilber et al. | |
| 7,265,440 B2 | 9/2007 | Zilber et al. | |
| 7,274,094 B2 | 9/2007 | Boon et al. | |
| 7,495,341 B2 | 2/2009 | Zilber et al. | |
| 7,495,462 B2* | 2/2009 | Hua | B81C 1/0023 324/750.3 |
| 7,566,853 B2 | 7/2009 | Tuckerman et al. | |
| 7,642,629 B2 | 1/2010 | Zilber et al. | |
| 7,731,433 B1* | 6/2010 | Heinemann | G02B 6/4246 385/88 |
| 7,859,033 B2 | 12/2010 | Brady | |
| 7,893,514 B2 | 2/2011 | Kwon et al. | |
| 7,955,885 B1* | 6/2011 | Bhugra | B81C 1/00301 257/E21.499 |
| 8,362,496 B1* | 1/2013 | Tu | H01L 25/167 257/80 |
| 8,432,011 B1* | 4/2013 | Oganesian | H01L 27/14618 257/415 |
| 8,455,973 B2* | 6/2013 | Fujii | G01P 15/0802 257/502 |
| 8,716,665 B2* | 5/2014 | Yao | G01S 7/4813 250/338.1 |
| 8,779,361 B2* | 7/2014 | Costello | G01D 5/34715 250/216 |
| 9,219,091 B2* | 12/2015 | Oganesian | H01L 27/14625 |
| 2003/0013217 A1* | 1/2003 | Dudoff | G02B 6/4204 438/27 |
| 2003/0189213 A1* | 10/2003 | Igaki | H01L 31/02325 257/81 |
| 2004/0251525 A1 | 12/2004 | Zilber | |
| 2004/0264888 A1* | 12/2004 | Go | G02B 6/325 385/92 |
| 2005/0062055 A1* | 3/2005 | Gallup | H01S 5/02288 257/98 |
| 2005/0104179 A1 | 5/2005 | Zilber | |
| 2005/0133808 A1 | 6/2005 | Uraya et al. | |
| 2005/0189474 A1* | 9/2005 | Tomioka | H01L 25/167 250/214.1 |
| 2005/0205977 A1 | 9/2005 | Zilber | |
| 2006/0016970 A1* | 1/2006 | Nagasaka | G01D 5/305 250/231.13 |
| 2006/0045530 A1* | 3/2006 | Lim | H04B 10/43 398/135 |
| 2006/0273430 A1* | 12/2006 | Hua | B81C 1/0023 257/621 |
| 2007/0025715 A1* | 2/2007 | Lin | H04N 5/23212 396/87 |
| 2007/0034777 A1 | 2/2007 | Tuckerman et al. | |
| 2007/0138498 A1 | 6/2007 | Zilber | |
| 2007/0190691 A1 | 8/2007 | Humpston | |
| 2007/0190747 A1 | 8/2007 | Humpston | |
| 2007/0194339 A1* | 8/2007 | Horio | H01L 25/167 257/99 |
| 2008/0012029 A1* | 1/2008 | Schranz | H01L 27/14621 257/88 |
| 2008/0012115 A1 | 1/2008 | Zilber | |
| 2008/0017879 A1 | 1/2008 | Zilber | |
| 2008/0083976 A1 | 4/2008 | Haba | |
| 2008/0083977 A1 | 4/2008 | Haba | |
| 2008/0099900 A1 | 5/2008 | Oganesian | |
| 2008/0099907 A1 | 5/2008 | Oganesian | |
| 2008/0116379 A1* | 5/2008 | Teder | B60S 1/0822 250/341.1 |
| 2008/0116544 A1 | 5/2008 | Grinman | |
| 2008/0116545 A1 | 5/2008 | Grinman | |
| 2008/0136955 A1* | 6/2008 | Kathman | G11B 7/123 348/340 |
| 2008/0150121 A1 | 6/2008 | Oganesian | |
| 2008/0239509 A1* | 10/2008 | Vinogradov | G02B 9/34 359/709 |
| 2008/0246136 A1 | 10/2008 | Haba | |
| 2009/0039377 A1* | 2/2009 | Horio | H01L 24/97 257/99 |
| 2009/0115047 A1 | 5/2009 | Haba | |
| 2009/0153729 A1 | 6/2009 | Hiltunen | |
| 2009/0160065 A1 | 6/2009 | Haba | |
| 2009/0212381 A1 | 8/2009 | Crisp | |
| 2010/0053407 A1 | 3/2010 | Crisp | |
| 2010/0225006 A1 | 9/2010 | Haba | |
| 2010/0230812 A1 | 9/2010 | Oganesian | |
| 2010/0237452 A1 | 9/2010 | Hagiwara et al. | |
| 2010/0317937 A1* | 12/2010 | Kuhn | A61B 5/0084 600/323 |
| 2010/0327164 A1* | 12/2010 | Costello | G01D 5/34715 250/338.1 |
| 2011/0012259 A1 | 1/2011 | Grinman | |
| 2011/0031629 A1 | 2/2011 | Haba | |
| 2011/0033979 A1 | 2/2011 | Haba | |
| 2011/0049696 A1 | 3/2011 | Haba | |
| 2011/0057108 A1* | 3/2011 | Yao | G01S 7/4813 250/338.4 |
| 2011/0057129 A1* | 3/2011 | Yao | G01S 7/4813 250/552 |
| 2011/0061340 A1* | 3/2011 | Lim | G01D 11/245 53/396 |
| 2011/0158273 A1* | 6/2011 | Okayama | B82Y 20/00 372/43.01 |
| 2011/0187007 A1 | 8/2011 | Haba | |
| 2012/0018863 A1 | 1/2012 | Oganesian | |
| 2012/0018868 A1 | 1/2012 | Oganesian | |
| 2012/0018893 A1 | 1/2012 | Oganesian | |
| 2012/0018894 A1 | 1/2012 | Oganesian | |
| 2012/0018895 A1* | 1/2012 | Oganesian | H01L 23/481 257/773 |
| 2012/0020026 A1* | 1/2012 | Oganesian | H01L 25/117 361/707 |

(56) References Cited

U.S. PATENT DOCUMENTS

| | | | |
|---|---|---|---|
| 2012/0025211 A1* | 2/2012 | Yeh | H01L 25/167 257/82 |
| 2012/0068327 A1 | 3/2012 | Oganesian | |
| 2012/0068330 A1 | 3/2012 | Oganesian | |
| 2012/0068351 A1 | 3/2012 | Oganesian | |
| 2012/0068352 A1 | 3/2012 | Oganesian | |
| 2012/0199925 A1* | 8/2012 | Oganesian | H01L 27/14609 257/432 |
| 2012/0218458 A1 | 8/2012 | Pavithran et al. | |
| 2012/0248625 A1* | 10/2012 | Coffy | G01S 7/4813 257/774 |
| 2012/0248977 A1* | 10/2012 | Ootorii | H01L 25/167 313/524 |
| 2012/0258563 A1 | 10/2012 | Ogino et al. | |
| 2012/0290255 A1* | 11/2012 | Kelkar | H01L 31/0232 702/150 |
| 2012/0313209 A1* | 12/2012 | Oganesian | H01L 27/14618 257/443 |
| 2013/0056844 A1* | 3/2013 | Oganesian | H01L 27/14618 257/443 |
| 2013/0075761 A1* | 3/2013 | Akiyama | H01L 27/288 257/80 |
| 2013/0188267 A1* | 7/2013 | Oganesian | H01L 27/14618 359/718 |
| 2013/0215290 A1 | 8/2013 | Solhusvik et al. | |
| 2013/0228819 A1* | 9/2013 | Engl | H01L 33/382 257/99 |
| 2013/0242155 A1* | 9/2013 | Oganesian | H04N 5/374 348/308 |
| 2013/0292705 A1* | 11/2013 | Makimura | H01L 31/02164 257/81 |
| 2013/0292706 A1* | 11/2013 | Costello | H01L 31/167 257/82 |
| 2013/0341650 A1* | 12/2013 | Peng | H01L 23/31 257/82 |
| 2014/0008679 A1* | 1/2014 | Deguchi | H01L 27/14618 257/98 |
| 2014/0027612 A1* | 1/2014 | Oganesian | H01L 27/14625 250/208.1 |
| 2014/0070349 A1* | 3/2014 | Oganesian | H01L 27/14685 257/432 |
| 2014/0084307 A1* | 3/2014 | Halbritter | G01S 7/4813 257/82 |
| 2014/0175462 A1* | 6/2014 | Lermer | H01L 25/167 257/82 |
| 2014/0191253 A1* | 7/2014 | Haslbeck | H01L 31/0203 257/82 |
| 2014/0225147 A1* | 8/2014 | Halbritter | H01L 33/58 257/98 |
| 2014/0231635 A1* | 8/2014 | Kerness | G01S 17/026 250/226 |
| 2014/0264691 A1* | 9/2014 | Oganesian | H01L 27/14636 257/432 |
| 2014/0264692 A1* | 9/2014 | Oganesian | H01L 27/14625 257/432 |
| 2014/0264693 A1* | 9/2014 | Oganesian | H01L 24/95 257/432 |
| 2014/0361200 A1* | 12/2014 | Rudmann | H01L 25/167 250/578.1 |
| 2015/0018611 A1* | 1/2015 | Lei | H01L 27/15 600/109 |
| 2015/0163425 A1* | 6/2015 | Oganesian | H04N 5/378 348/302 |
| 2015/0204511 A1* | 7/2015 | Rudmann | H01L 25/167 362/235 |
| 2015/0226839 A1* | 8/2015 | Brandl | H01L 25/167 250/221 |
| 2015/0243802 A1* | 8/2015 | Fujimoto | H01L 31/02327 257/82 |
| 2015/0243824 A1* | 8/2015 | Bhat | H01L 31/102 250/552 |
| 2015/0279827 A1* | 10/2015 | Tu | H01L 31/02325 257/81 |
| 2015/0372041 A1* | 12/2015 | Mitsuhashi | H01L 27/14627 257/432 |

OTHER PUBLICATIONS

U.S. Appl. No. 13/157,193, filed Jun. 9, 2011, Oganesian, Vage.
U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesium, Vage.
U.S. Appl. No. 13/312,826, filed Dec. 6, 2011, Oganesian, Vage.
U.S. Appl. No. 13/301,683, filed Nov. 21, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.
U.S. Appl. No. 13/157,193, filed Jun. 2011, Oganesian.

* cited by examiner

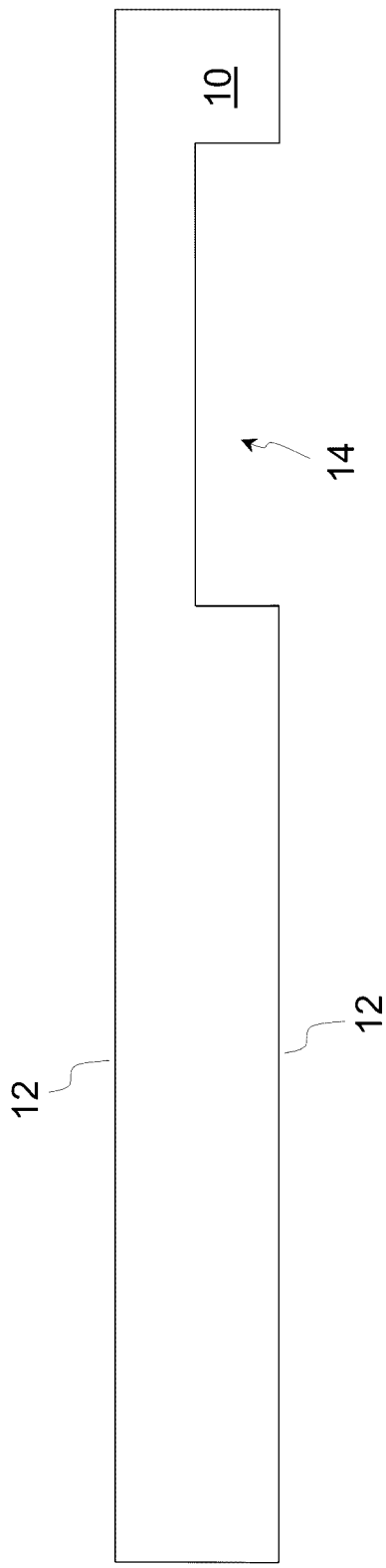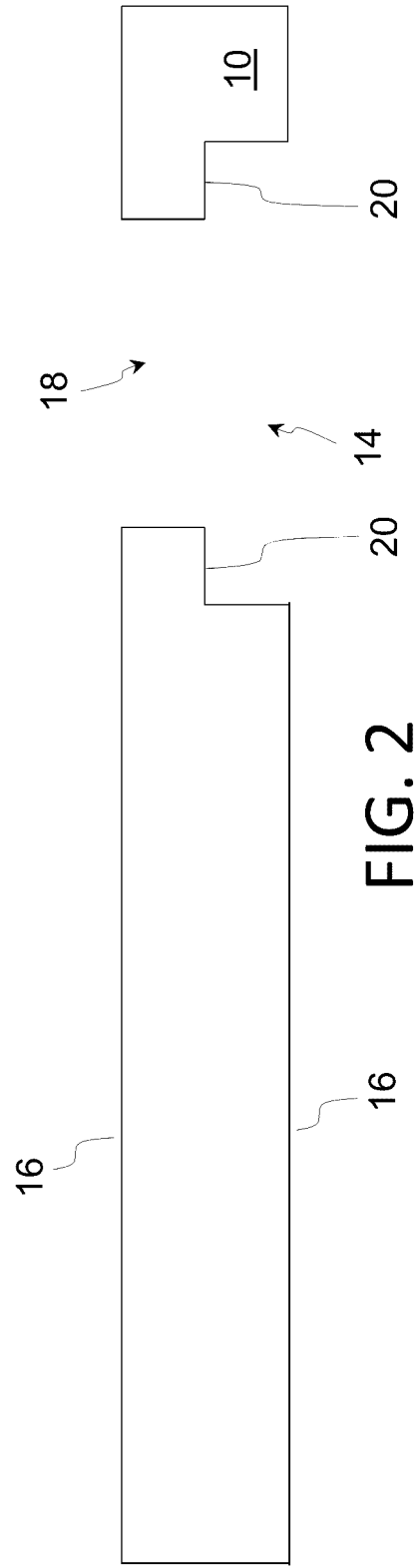

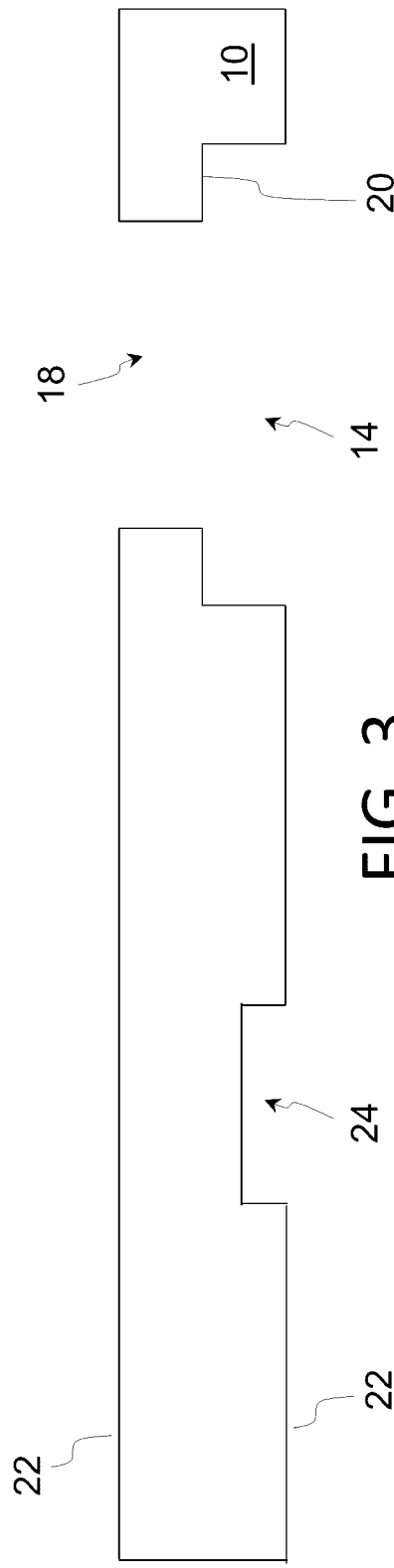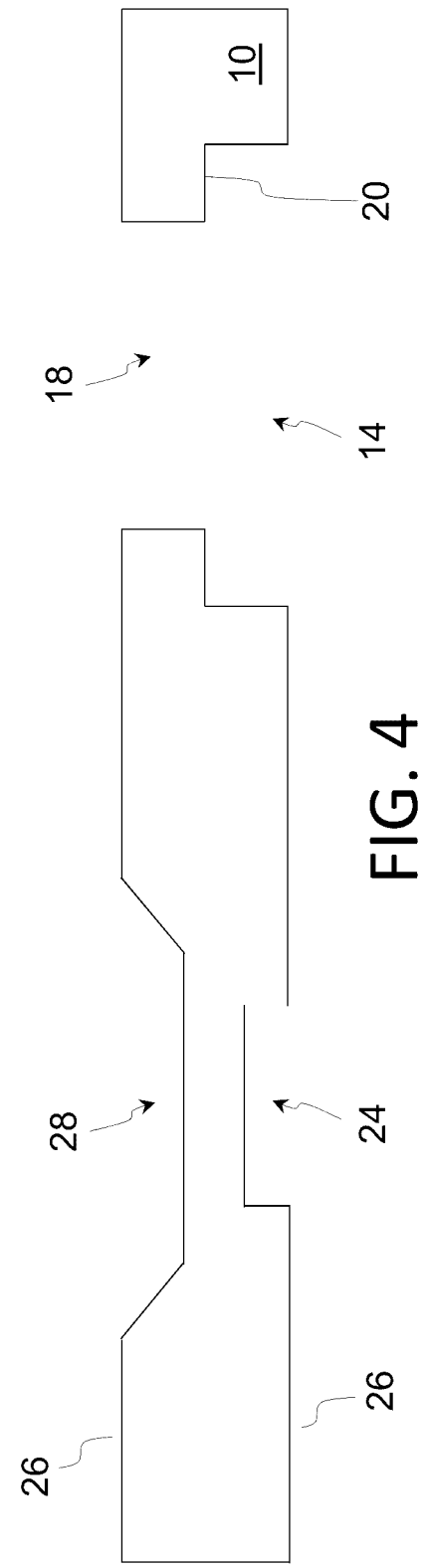

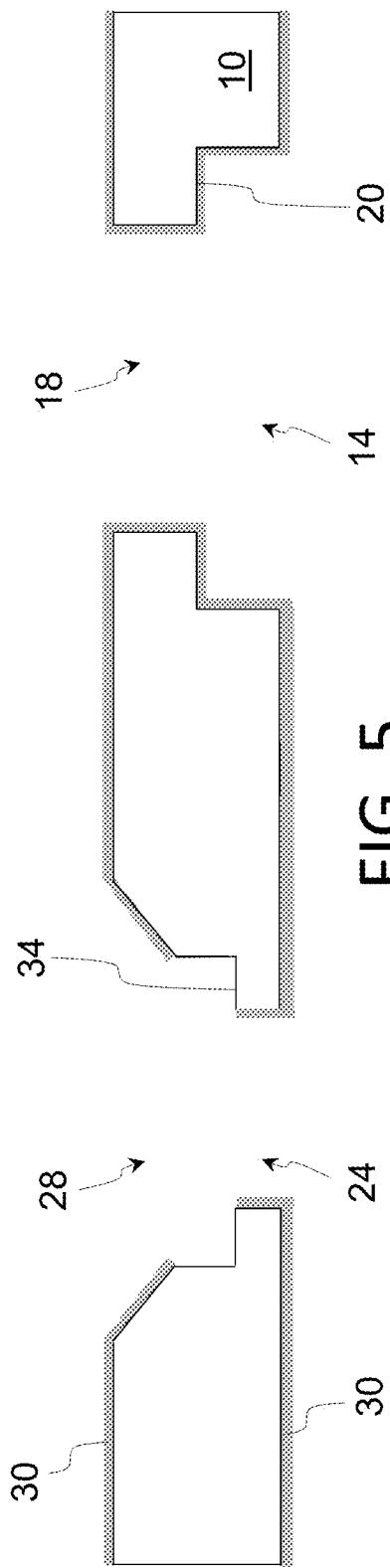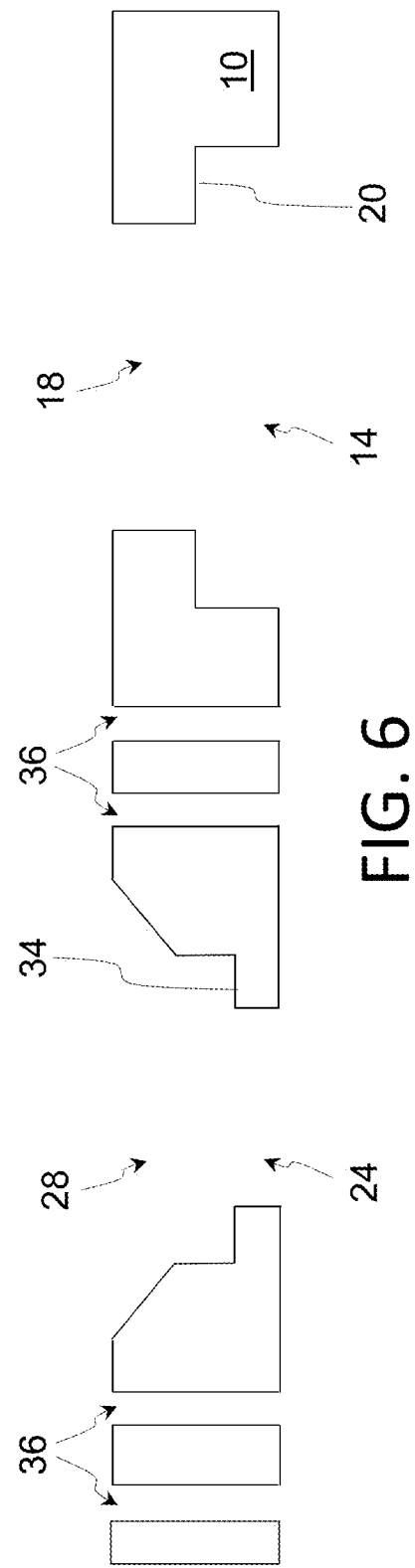

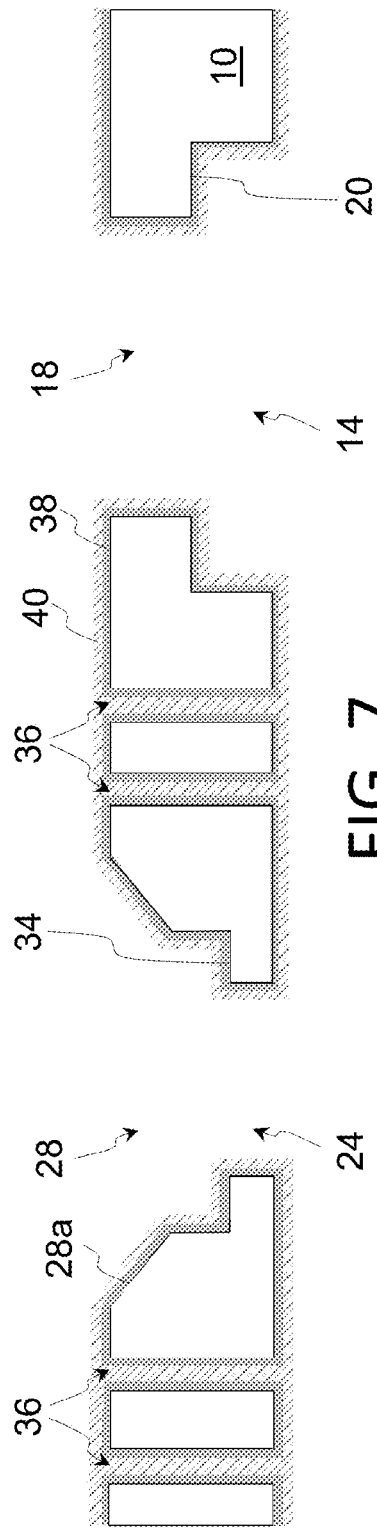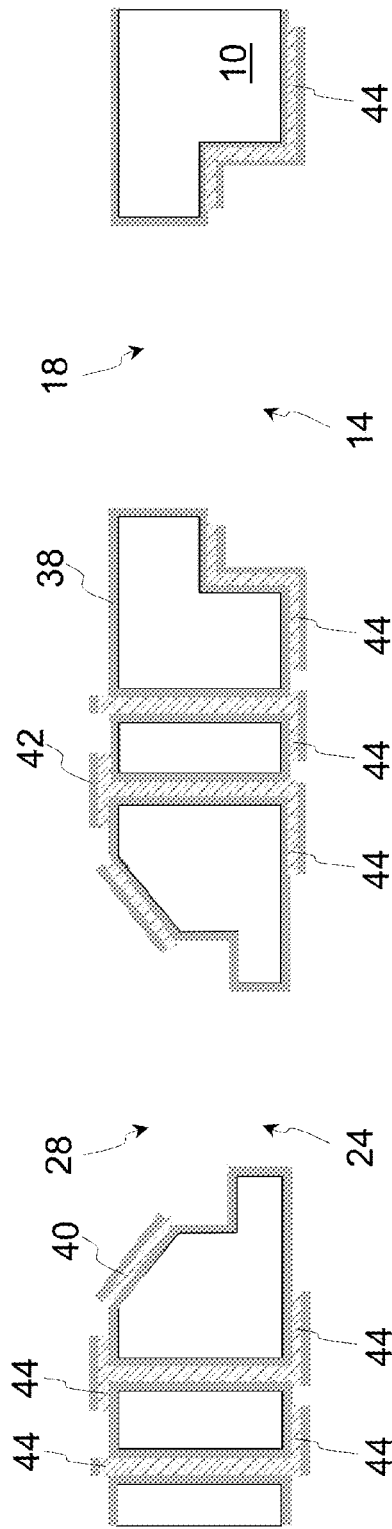

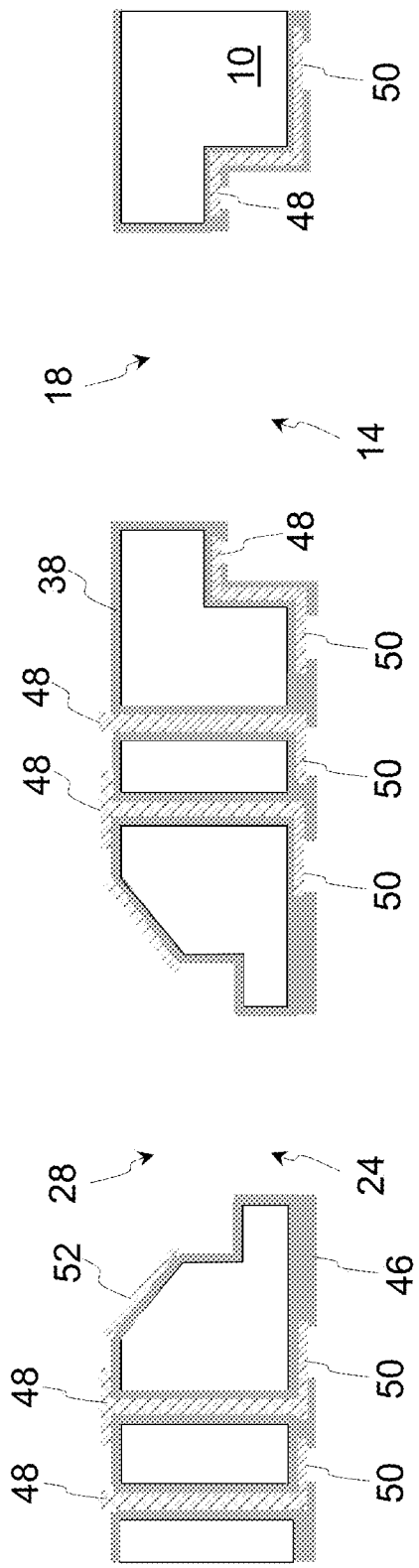
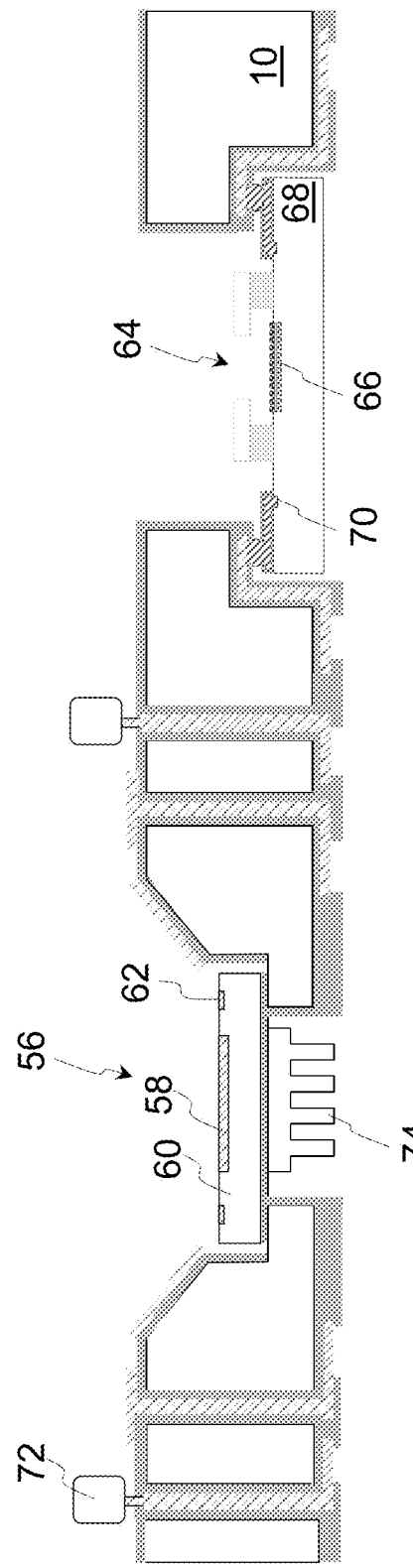
FIG. 9
FIG. 10

INTEGRATED CAMERA MODULE AND METHOD OF MAKING SAME

RELATED APPLICATIONS

This application claims the benefit of U.S. Provisional Application No. 61/870,084, filed Aug. 26, 2013, and which is incorporated herein by reference.

FIELD OF THE INVENTION

The present invention relates to camera modules used on mobile devices such as cell phones.

BACKGROUND OF THE INVENTION

The present invention relates to the method of compaction for a mobile camera system by reducing its overall size. More specifically, abundance of real estate can be gained by improving the outdated LED packaging technology used in conjunction with mobile camera devices.

Over the years, a great deal of research and work has been made into reducing the size of image sensor die and its packaging size. Using advanced wafer level technology, manufacturers can now achieve chip scale package, which means the complete package's real estate area is no larger than the die itself.

Meanwhile, the LED (light emitting diode) unit used as a flash source for the camera unit (and commonly used as a flashlight in a flashlight mode) is still using very primitive packing technology that was outdated long ago, and it has no place in today's mobile devices. Typically, the LED unit is a separate component from the camera unit, and is connected thereto using a flex PCB or other connector. Not only does this configuration use excessive space, but it requires a separate mounting structure to secure these two separate components adjacent each other so that they can then be electrically connected to each other.

There is a need for a compact solution for both the camera unit and the LED unit used as a light source for the camera unit.

BRIEF SUMMARY OF THE INVENTION

The aforementioned problems and needs are addressed by a camera module that includes a substrate of conductive silicon having top and bottom surfaces, a sensor device and an LED device. The substrate includes a first cavity formed into the bottom surface of the substrate and having an upper surface, an aperture extending from the first cavity upper surface to the top surface of the substrate, and a second cavity formed into the top surface of the substrate and having a lower surface. The sensor device includes at least one photodetector, is disposed at least partially in the first cavity, and is mounted to the first cavity upper surface. The LED device includes at least one light emitting diode, is disposed at least partially in the second cavity, and is mounted to the second cavity lower surface.

A method of forming a camera module includes providing a substrate of conductive silicon having top and bottom surfaces, forming a first cavity into the bottom surface of the substrate, the first cavity having an upper surface, forming an aperture extending from the first cavity upper surface to the top surface of the substrate, forming a second cavity into the top surface of the substrate, the second cavity having a lower surface, mounting a sensor device to the first cavity upper surface wherein the sensor device includes at least one photodetector, and mounting an LED device to the second cavity lower surface, wherein the LED device includes at least one light emitting diode.

Other objects and features of the present invention will become apparent by a review of the specification, claims and appended figures.

BRIEF DESCRIPTION OF THE DRAWINGS

FIGS. 1-13 are side cross sectional views of a substrate handler showing the sequential steps in forming the camera module of the present invention.

DETAILED DESCRIPTION OF THE INVENTION

Figure 11:
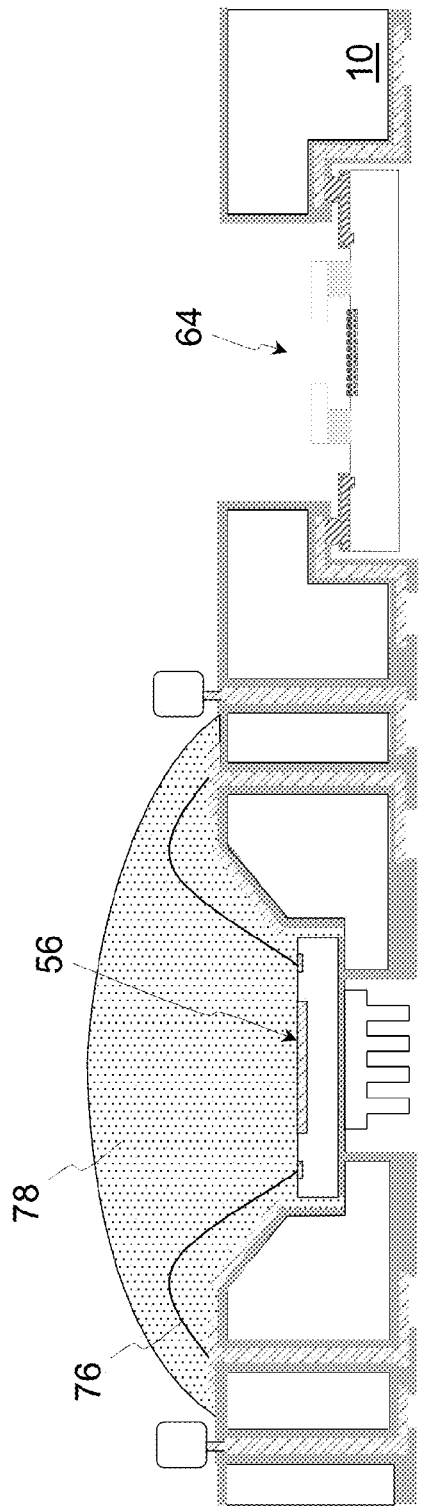

The present invention is a camera module size reduction solution. By using wafer level technology on the LED unit and also merging the LED unit and the image sensor die onto a single handler, greater space savings and electrical connectivity, and closer proximity and alignment between the image sensor and LED unit, can be achieved.

The formation of the camera module 1 begins with a conductive silicon substrate (wafer) 10, also referred to as the handler. This substrate 10 will be shaped into a host substrate for the LED die and the image sensor die. A layer of photoresist 12 is deposited on the silicon substrate 10 (at least on the top and bottom surfaces). The photoresist deposition method can be spray coating or any another appropriate deposition method(s). The photoresist 12 is exposed and etched using appropriate photolithography processes that are well known in the art to selectively remove just a portion of the photoresist 12, leaving exposed a selected portion of the bottom surface of the substrate 10. An anisotropic dry etch is applied to the exposed portion of the silicon substrate to form a first cavity 14 into the bottom surface of the silicon substrate 10, resulting in the structure in FIG. 1. The enchant can be CF4, SF6, NF3, Cl2, CCl2F2 or any other appropriate etchant. The first cavity can have slanted/tapered side walls, or vertical side walls as shown in 1.

After the photo resist 12 is removed (e.g. by using sulfuric acid, acetone or any other photoresist stripping method that are well known in the art), another layer of photo resist 16 is deposited on the silicon substrate 10 (at least on the top and bottom surfaces, including the surfaces inside the first cavity 14). The photoresist deposition method can be spray coating or any another appropriate deposition method(s). The photoresist 16 is exposed and etched using appropriate photolithography processes that are well known in the art to selectively remove portions of photoresist 16, leaving exposed a portion of the top surface of the substrate 10 that is over first cavity 14, and a corresponding portion of the top surface of first cavity 14. An anisotropic dry etch is applied to the exposed portions of silicon substrate 10 to form an aperture 18 that extends through the substrate 10 (from the cavity top surface to the substrate top surface), as illustrated in FIG. 2. The Enchant can be CF4, SF6, NF3, Cl2, CCl2F2 or any other appropriate etchant. Preferably, the lateral dimensions of aperture 18 are smaller than the lateral dimensions of first cavity 14, leaving shoulders 20 of substrate 10 at the boundary of first cavity 14 and aperture 18 (i.e. a portion of the upper surface of first cavity 14 forms shoulder 20).

After photoresist 16 is removed, another layer of photoresist 22 is deposited on the silicon substrate 10 (at least on the top and bottom substrate surfaces, inside the first cavity 14, and the inside the aperture 18). The photoresist 22 is exposed and etched using appropriate photolithography processes that are well known in the art to selectively remove a portion of photoresist 22, leaving exposed a portion of the bottom surface of substrate 10. An anisotropic dry etch is applied to the exposed portion of silicon substrate 10, leaving a second cavity 24 formed into the bottom surface of the substrate 10, as illustrated in FIG. 3. The second cavity 24 can have slanted/tapered side walls, or vertical side walls as shown in 3.

After photoresist 22 is removed, another layer of photoresist 26 is deposited on the silicon substrate 10 (at least on the top and bottom substrate surfaces, inside the first and second cavities 14 and 24, and the inside the aperture 18). The photoresist 26 is exposed and etched using appropriate photolithography processes that are well known in the art to selectively remove a portion of photoresist 26, leaving exposed a portion of the top surface of substrate 10 (opposite the second cavity 24). An anisotropic dry etch is applied to the exposed portion of silicon substrate 10, leaving a third cavity 28 formed into the top surface of the substrate 10, as illustrated in FIG. 4. The third cavity 28 can have vertical side walls, or slanted/tapered side walls as shown in 4.

After photoresist 26 is removed, another layer of photoresist 30 is deposited on the silicon substrate 10 (at least on the top and bottom substrate surfaces, inside cavities 14, 24, 28 and the inside the aperture 18). The photoresist 30 is exposed and etched using appropriate photolithography processes that are well known in the art to selectively remove a portion of photoresist 26, leaving exposed a portion of the bottom surface of third cavity 28. An anisotropic dry etch is applied to the exposed portion of silicon substrate 10, which extends downwardly the third cavity 28 until it meets the second cavity 24 (resulting in a second shoulder 34 where the second and third cavities 24, 28 meet—i.e. a portion of the lower surface of the third cavity 28 forms shoulder 34), as shown in FIG. 5.

After photoresist 30 is removed, a plurality of VIA holes 36 are next formed that extend through the substrate 10 (i.e. extend from the top surface to the bottom surface of the substrate 10). The VIA holes 36 can be made by laser, dry etch, wet etch or any another appropriate VIA hole forming method(s) that are well known in the art. Preferably, a dry plasma etch is used to form the VIA holes 36. The VIA holes 36 can have tapered sidewalls (i.e. funnel shaped holes), or vertical sidewalls as shown in FIG. 6. The number and positions of the VIA holes 36 can vary depending on the layout of the module, and are not limited to the four exemplary VIA holes 36 illustrated in FIG. 6.

A layer of dielectric material 38 is formed on the various surfaces of the silicon substrate 10 (including in holes 36 and in cavities 14, 24, 28). For example, dielectric layer 38 can be a spray coated polymer, or any other appropriate dielectric material (e.g. silicon oxide, silicon nitride, etc.). A layer of electrically conductive material 40 is formed over the dielectric layer 38. The electrically conductive layer 40 can be copper, aluminum, conductive polymer and/or any other appropriate electrically conductive material(s). The electrically conductive layer can be deposited by Physical Vapor Deposition (PVD), Chemical Vapor Deposition (CVD), plating or any other appropriate deposition method(s). Preferably, the electrically conductive layer 40 is a first layer of titanium and a second layer of aluminum, both deposited by Physical Vapor Deposition (PVD). The VIA holes 36 are either coated with the electrically conductive material 40, or completely filled with the electrically conductive material 40 as shown in FIG. 7, to form electrically conductive leads extending through the substrate 10. Optionally, angled sidewall reflector portions 28a of third cavity 28 can have their reflective index increased by the deposition of an additional layer of silver or any other appropriate reflective material on that portion of the electrically conductive layer 40.

A layer of photoresist 42 is deposited on the conductive layer 40. Photoresist is exposed and etched using appropriate photolithography processes that are well known in the art to selectively remove the photoresist 42, leaving portions of the conductive material exposed. Using dry or wet etching methods, exposed portions of the conductive material 40 are removed. The remaining portions of the conductive material 40 constitute conductive leads 44 (including the conductive material 40 in the VIA holes 36 and in the first cavity 14), and the reflector portions 28a (in the third cavity 28). Preferably, appropriate wet etching chemicals are used for this etching step. The resulting structure is shown in FIG. 8.

After photoresist 42 is removed, an encapsulant layer 46 of insulation material is deposited on the bottom side of the silicon substrate 10, including over the conductive leads 44. Encapsulant layer 46 can be polyimide, ceramics, polymer, polymer composite, metallic oxide, silicon dioxide, epoxy, silicone, porcelain, nitrides, glass, ionic crystals, resin, or a combination of aforementioned materials or any other appropriate dielectric material(s). Encapsulant layer 46 is preferably 1 to 3 µm in thickness, and the preferred material is liquid photolithography polymer such as solder mask which can be deposited by spray coating. If the VIA holes 36 are coated but not filled with the conductive material 40, then optionally, the VIA holes 36 can be filled by the encapsulation material 46. Portions of the encapsulation layer 46 are selectively removed (e.g. using well known lithography process(es)), to expose selected portions of the underlying conductive layer 40, which constitute contact pads 48 and the rerouted contact pads 50. There are also contact pads 48 on the top surface of the substrate as well, and a reflector portion. The resulting structure is shown in FIG. 9.

An LED device (e.g. die) 56 is picked and placed onto the shoulder 34 between the second and third cavities 24, 28, and glued into place. The LED die 56 includes one or more light emitting diodes 58 formed on or in a substrate 60 and electrically connected to bond pads 62 on the die substrate 60. LED die 56 is well known in the art, and therefore not further described herein. A sensor device (e.g. CMOS sensor package) 64 is mounted onto shoulder 20 in the first cavity 14, for example, by electrical connectors (e.g. ball grid connectors) between the contact pads of each. CMOS sensor package 64 includes a plurality of photo detectors formed on or in a substrate 68 and electrically connected to contact pads 70 on the substrate 68. CMOS sensor package 64 is well known in the art, and therefore not further described herein. An optional power capacitor 72 can be mounted by a standard pick and place SMT technique to one of the contact pads 48. An optional heat sink 74 can be mounted to the back side of the LED die 56 and within the handler's second cavity 24. The resulting structure is illustrated in FIG. 10.

Figure 12:
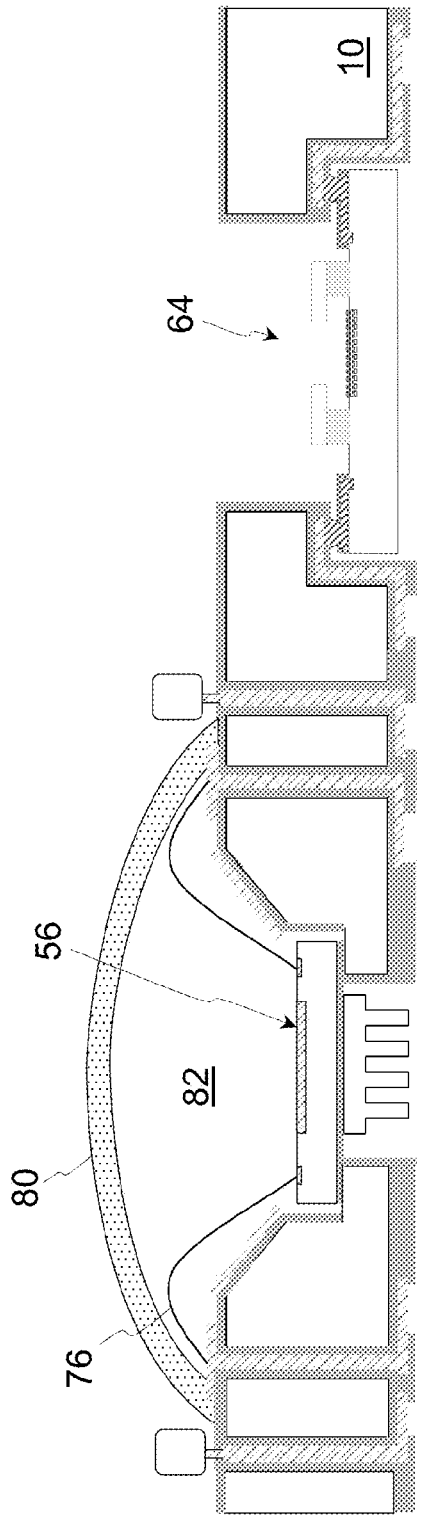

A conventional wirebonding technique can be used to connect the LED bond pads 62, to the contact pads 48 over or connected to the conductive material 40 in the VIA holes 36, with bonding wires 76. A lens/encapsulant 78 is then deposited over the LED die 56 and its wirebonds 76, which protects the wirebonding 76 and also acts as a lens for the light emitted from the LEDs 58, as illustrated in FIG. 11. The lens/encapsulant can be made of acrylic plastic, epoxy or any other appropriate materials. Alternatively, the lens/encapsulant can be made as a curved member 80 of pre-molded glass, plastic or any other appropriate lens worthy material. The curved member 80 is hermetically sealed and forms a cavity 82 containing and protecting the LED die 56 and its wirebonding 76, as illustrated in FIG. 12. The cavity 82 can be filled with any appropriate gas, liquid or even be evacuated (i.e. a vacuum).

Figure 13:
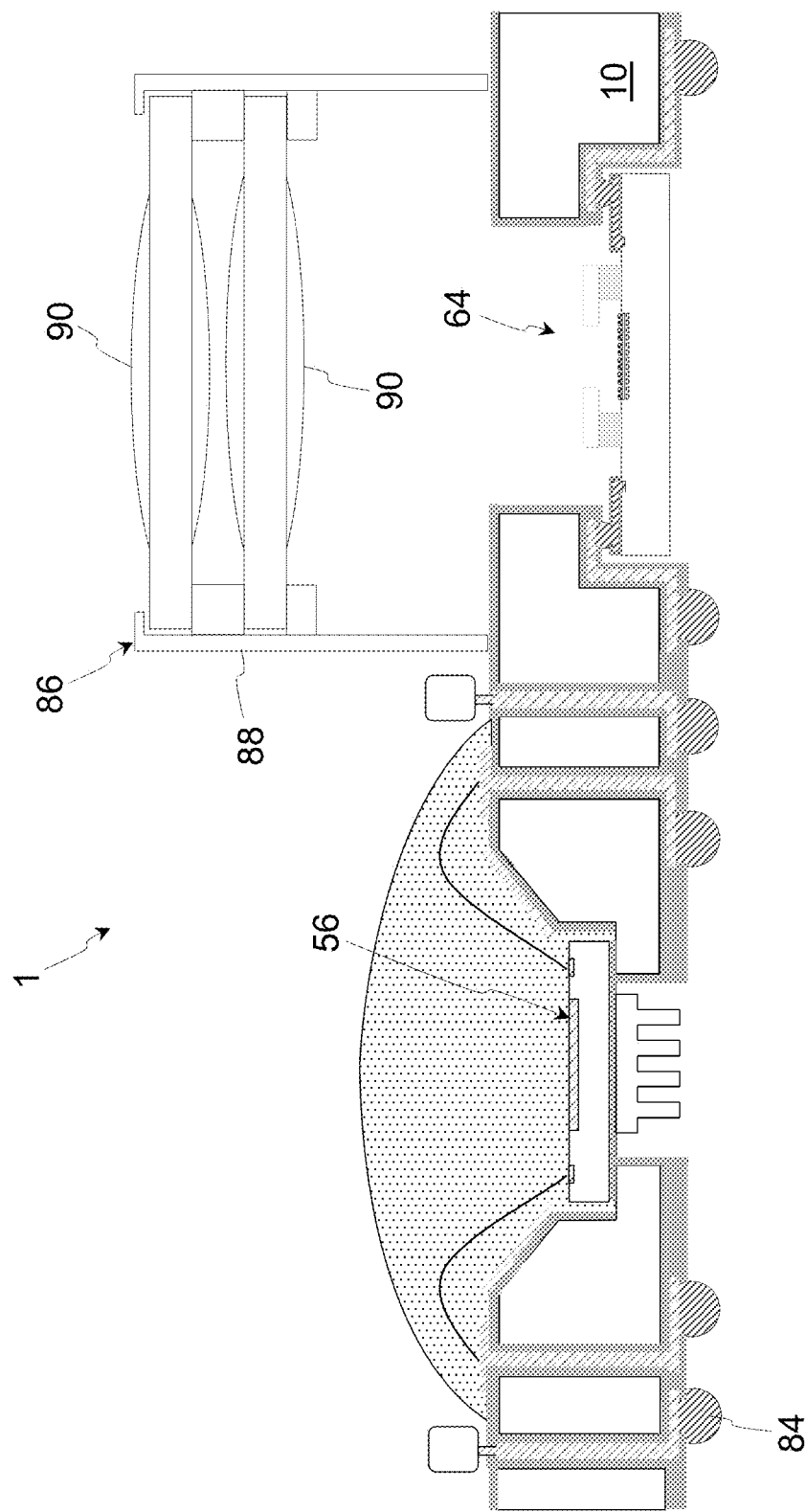

Interconnects 84, such as ball grid array (BGA), land grid array (LGA), bumping, copper pillar or any other appropriate interconnects are formed on and in electrical connection with the contact pads 48, 50 on the bottom surface of the substrate 10. Ball grid array is one of the preferred methods of interconnection and it can be deposited by screen printing followed by a reflow process. An optional lens or lens module of choice is bonded on to substrate 10 and disposed over the active area of the image sensor 64, thus encapsulating the side of sensor 64 containing the photodetectors 66. Preferably, a lens module 86, having a housing 88 in which lenses 90 are secured, is mounted to the upper surface of substrate 10 and over aperture 18. The final structure of camera module 1 is shown in FIG. 13.

The camera module 1 is a compact, integrated packaging of both the image sensor package 64 and the LED light source 56. The substrate 10 provides locations on which to securely mount the image sensor 64 and LED light source 56, and provides electrical connectivity for both devices, with all electrical contacts for both devices 56, 64 on the bottom surface of the substrate 10. Handler 10 not only provides electrical connections for image sensor package 64 and LED light source 56, but provides mechanical protection for these devices as well, as both devices are recessed between the top and bottom surfaces of handler 10 (although the relative heights of these components can be different).

Figure 14A:
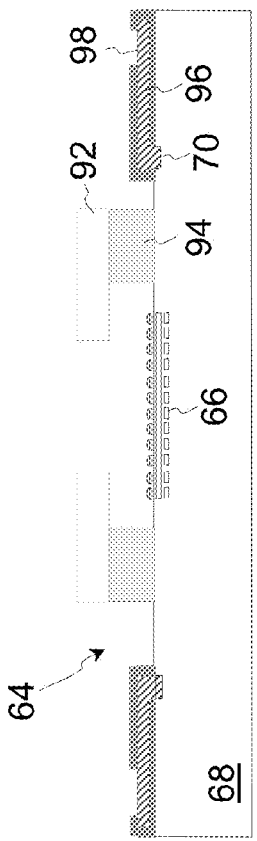
FIGS. 14A-14C are side cross sectional views showing various configurations of the sensor package.
Figure 14B:
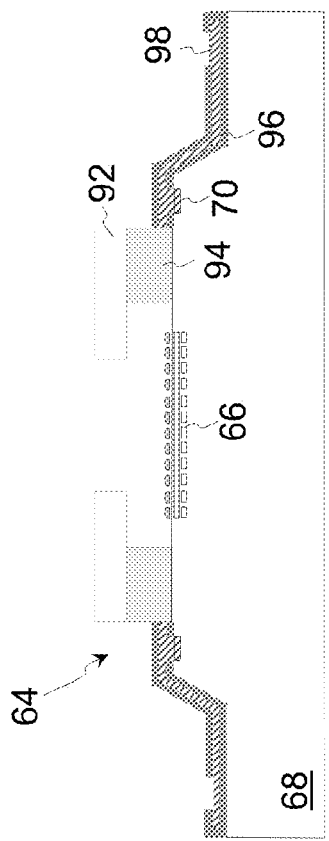
Figure 14C:
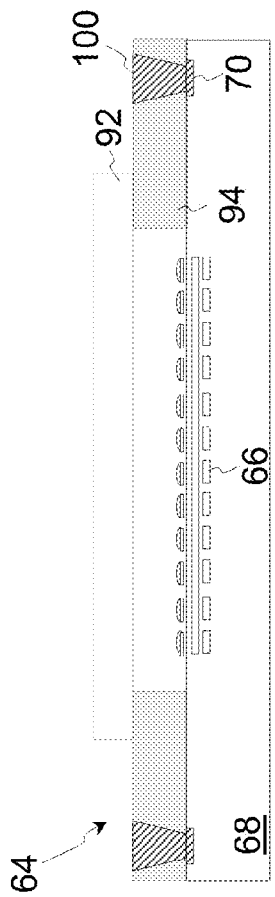

FIGS. 14A-14C illustrate various embodiments of the image sensor 64. As shown in FIG. 14 A, a protective substrate 92 can be mounted over the photodetectors 66 using a spacer material 94. Leads 96 with rerouted contact pads 98 can be formed on the upper surface of substrate 68. The image sensor in FIG. 14A is shown as the image sensor 64 used for camera module 1 in FIGS. 10-13. As shown in FIG. 14B, the leads 96 (electrically connected to contact pads 70) and rerouted contact pads 98 can be formed down into a trench or recess formed into the top surface of substrate 68. As shown in FIG. 14C, the protective substrate 92 can be formed without a center aperture (as shown in the other embodiments) to seal the active area of the sensor. Additional, electrical contacts 100 (electrically connected to contact pads 70) can be formed through the spacer material 94.

Figure 15A:
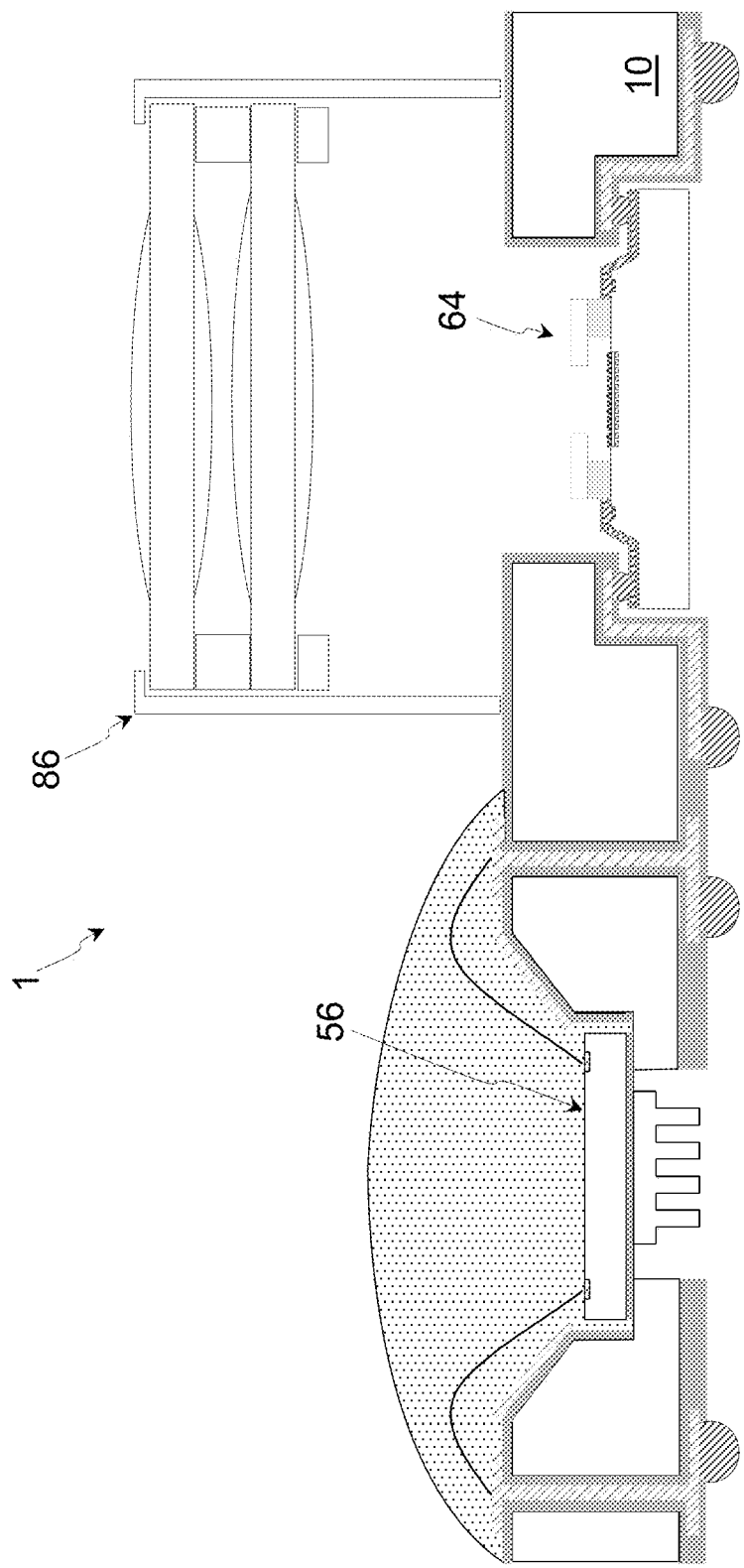
FIGS. 15A-15H are side cross sectional views showing varying embodiments of the camera module of the present invention.
Figure 15B:
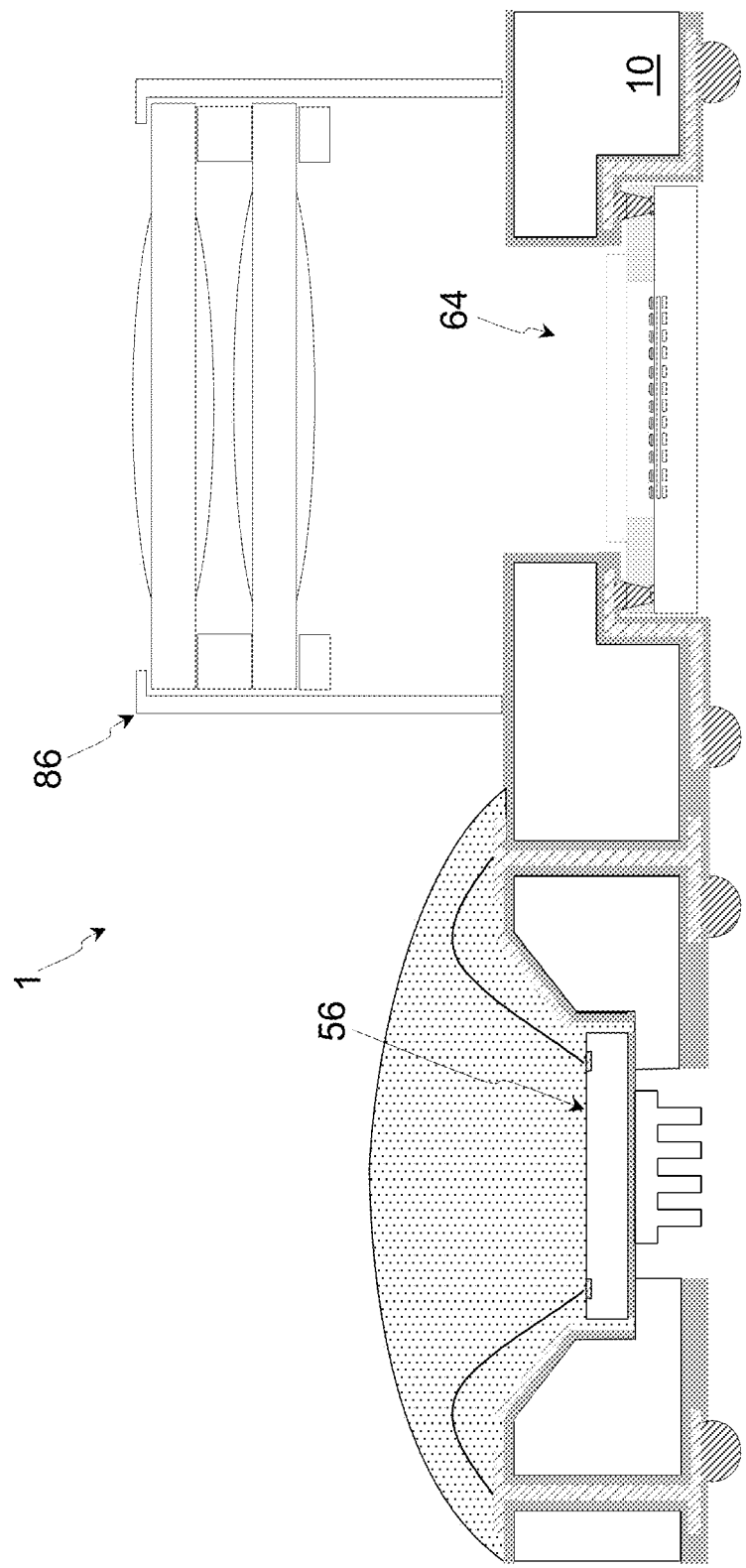
Figure 15C:
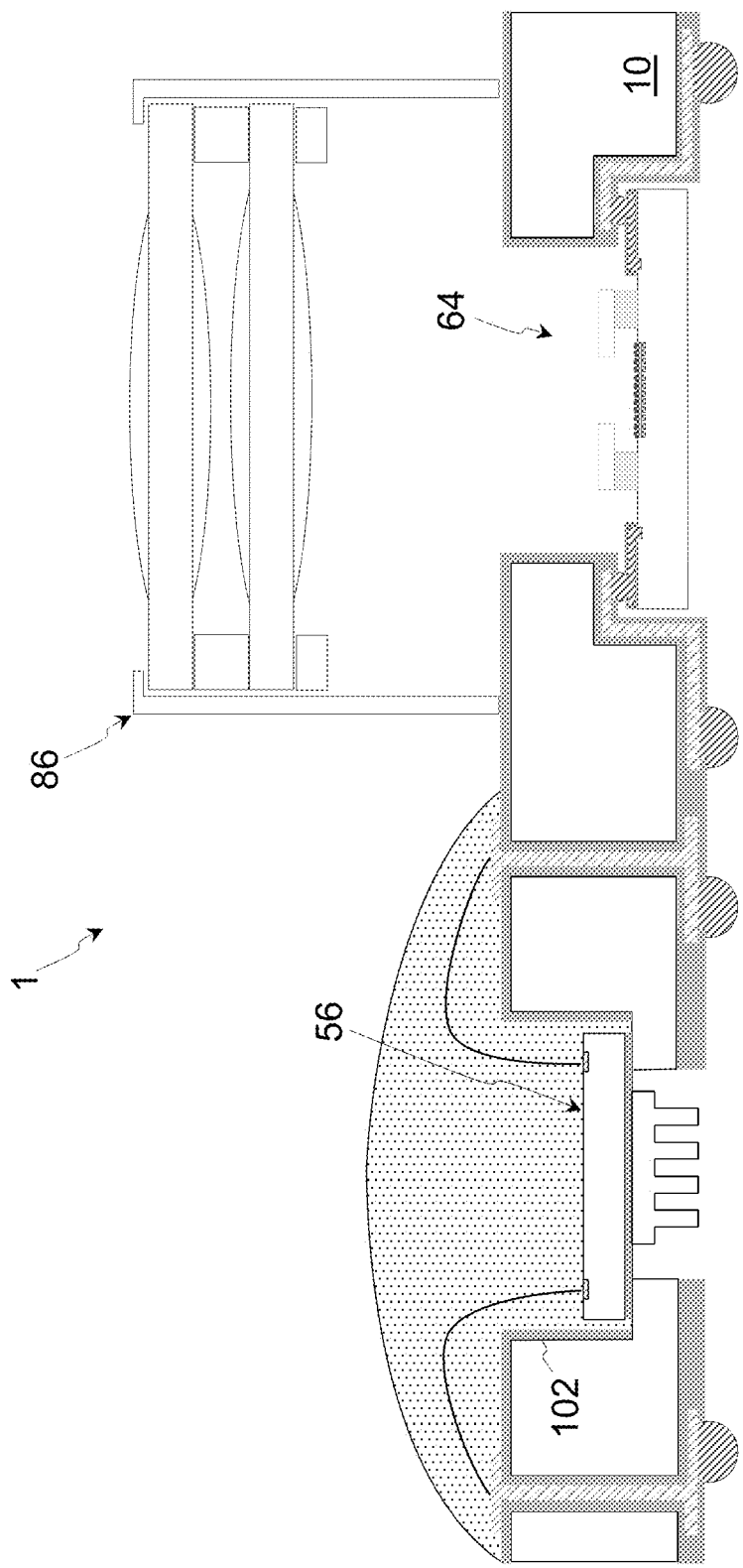
Figure 15D:
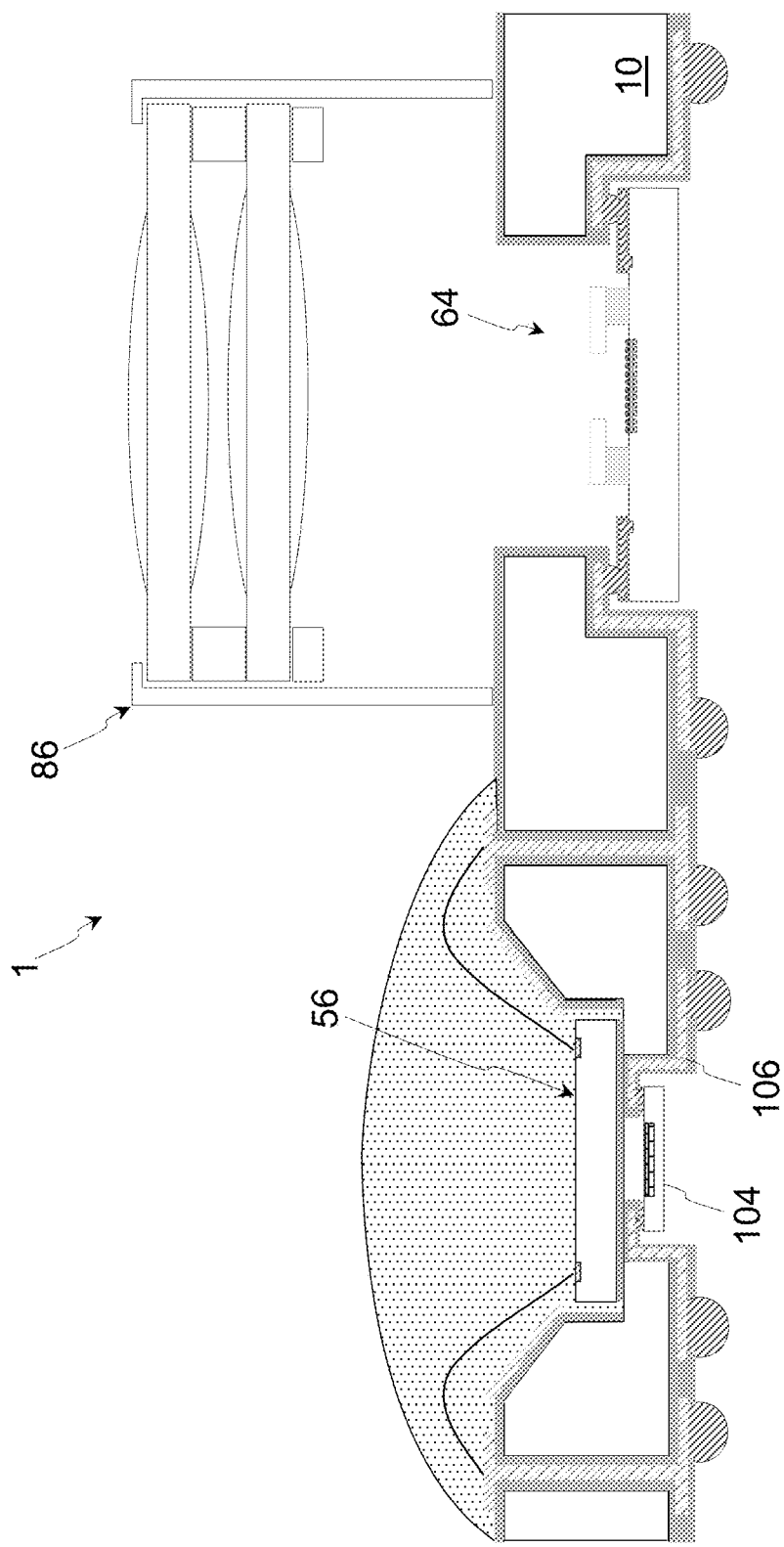
Figure 15E:
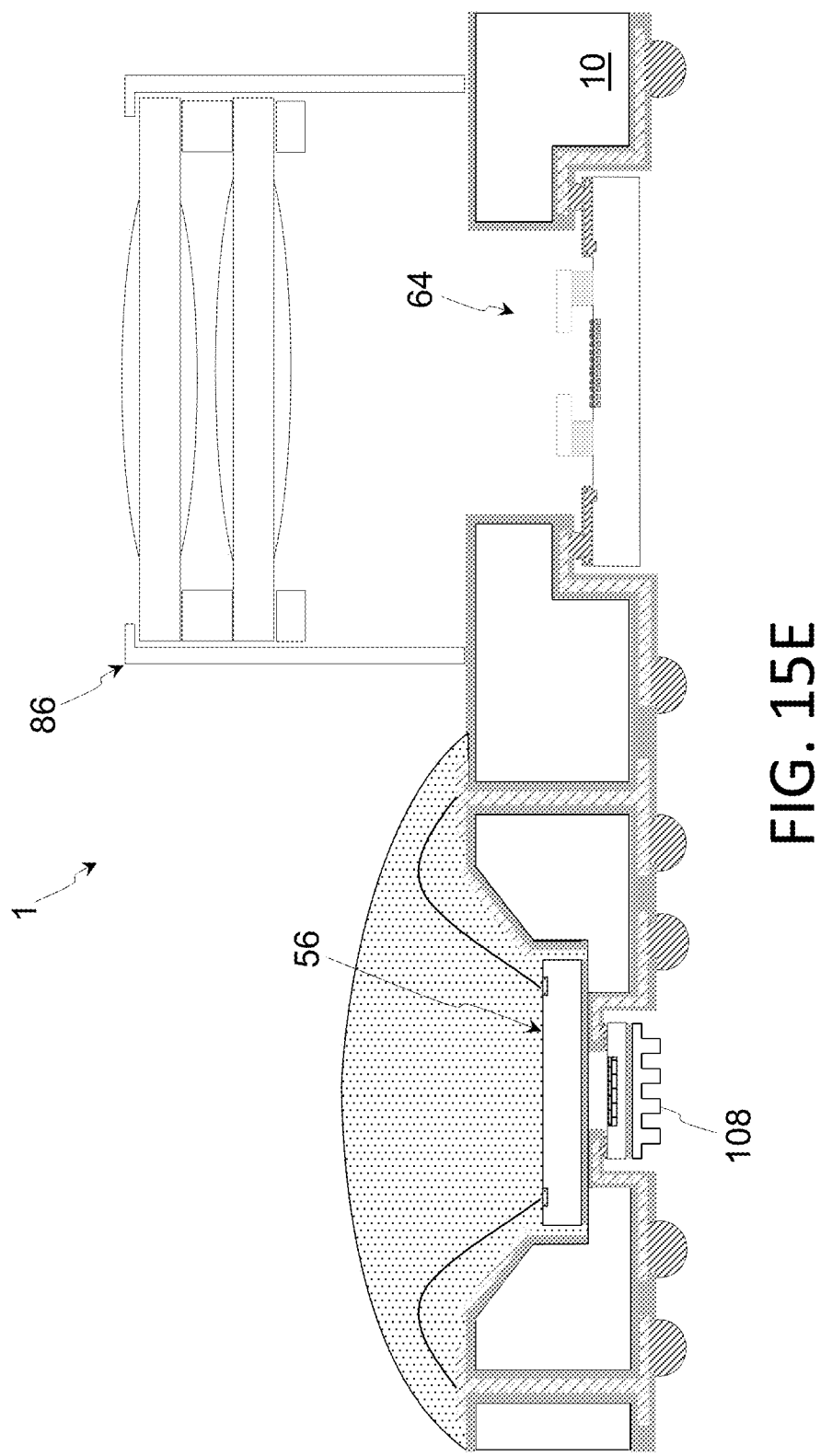
Figure 15F:
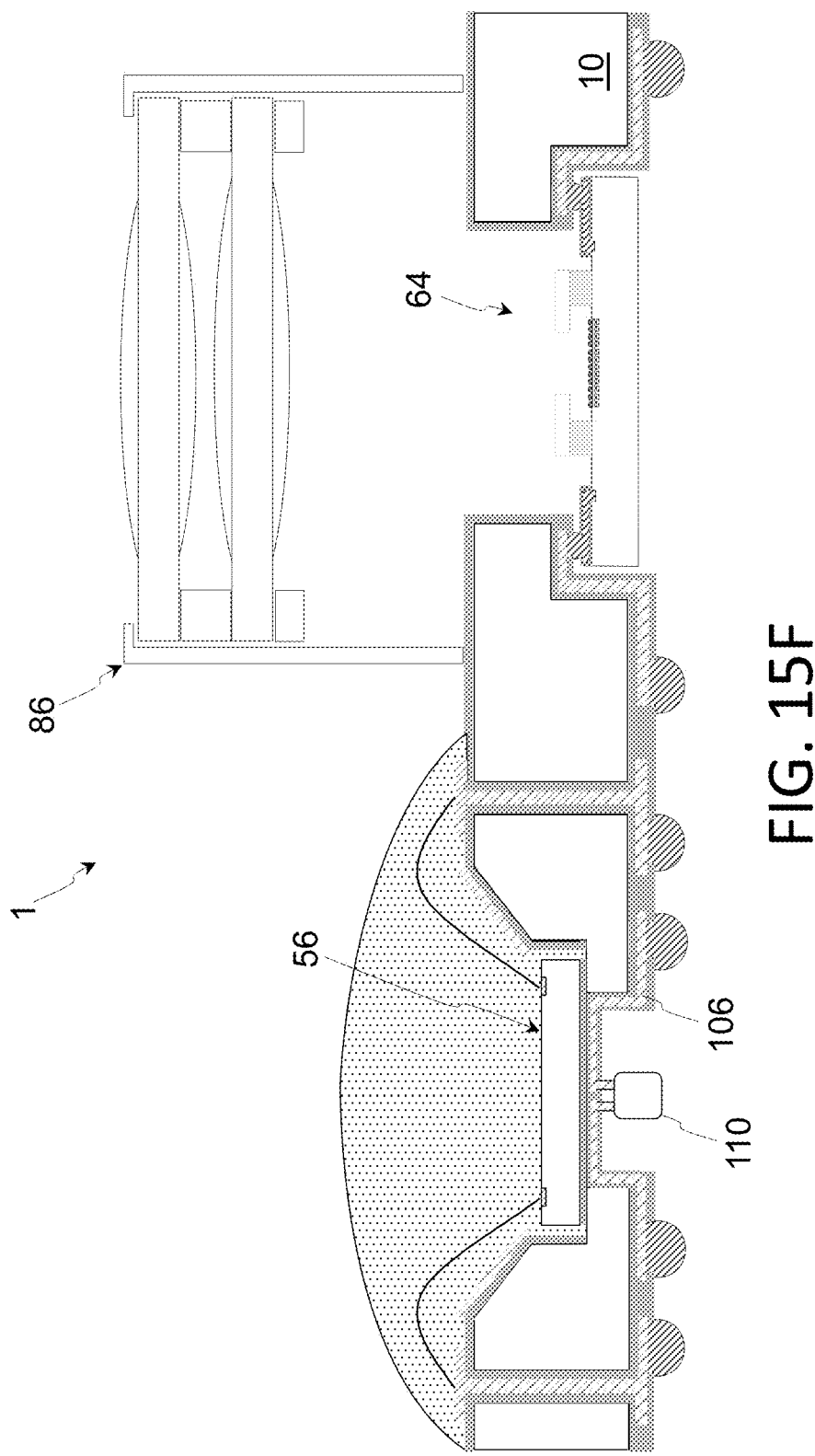
Figure 15G:
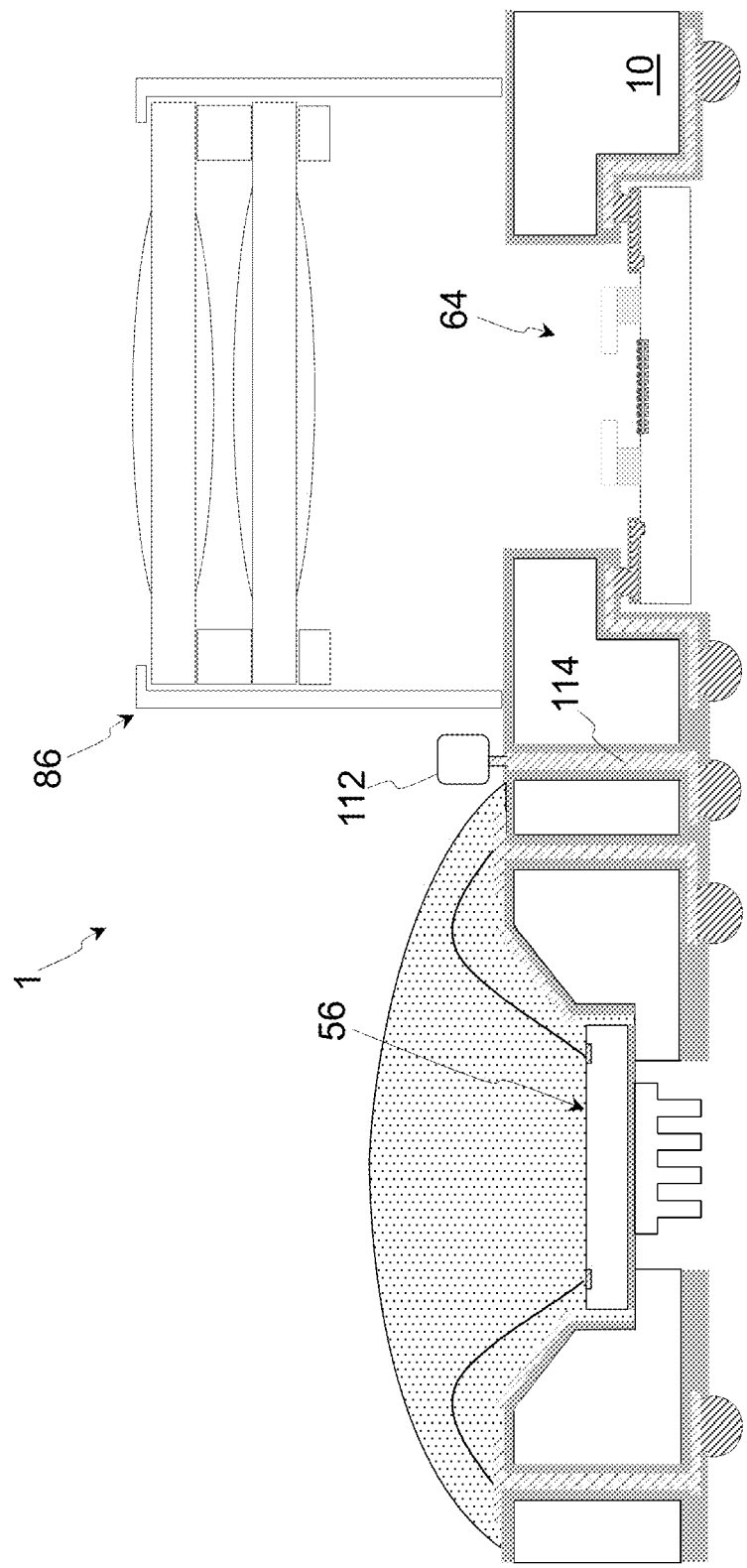

FIGS. 15A-15H illustrate alternate embodiments of the camera module 1. Specifically, FIG. 15A shows the camera module 1 with the image sensor 64 of FIG. 14B. FIG. 15B shows the camera module 1 with the image sensor 64 of FIG. 14C. FIG. 15C shows the use of vertical side walls 102 for the third cavity 28. FIG. 15D shows the inclusion of a logic chip 104 mounted under the LED die 56 (in second cavity 24) and to electrical leads 106. FIG. 15E shows a heat sink 108 mounted to the logic chip 104 of FIG. 15D. FIG. 15F shows the inclusion of a power capacitor 110 mounted under the LED die 56 (in second cavity 24) and to electrical leads 106. FIG. 15G shows the inclusion of a power capacitor 112 mounted to the top surface of substrate 10, with its electrical connection rerouted through an electrical connector 114 in a via hole to the bottom surface of the substrate 10.

Figure 15H:
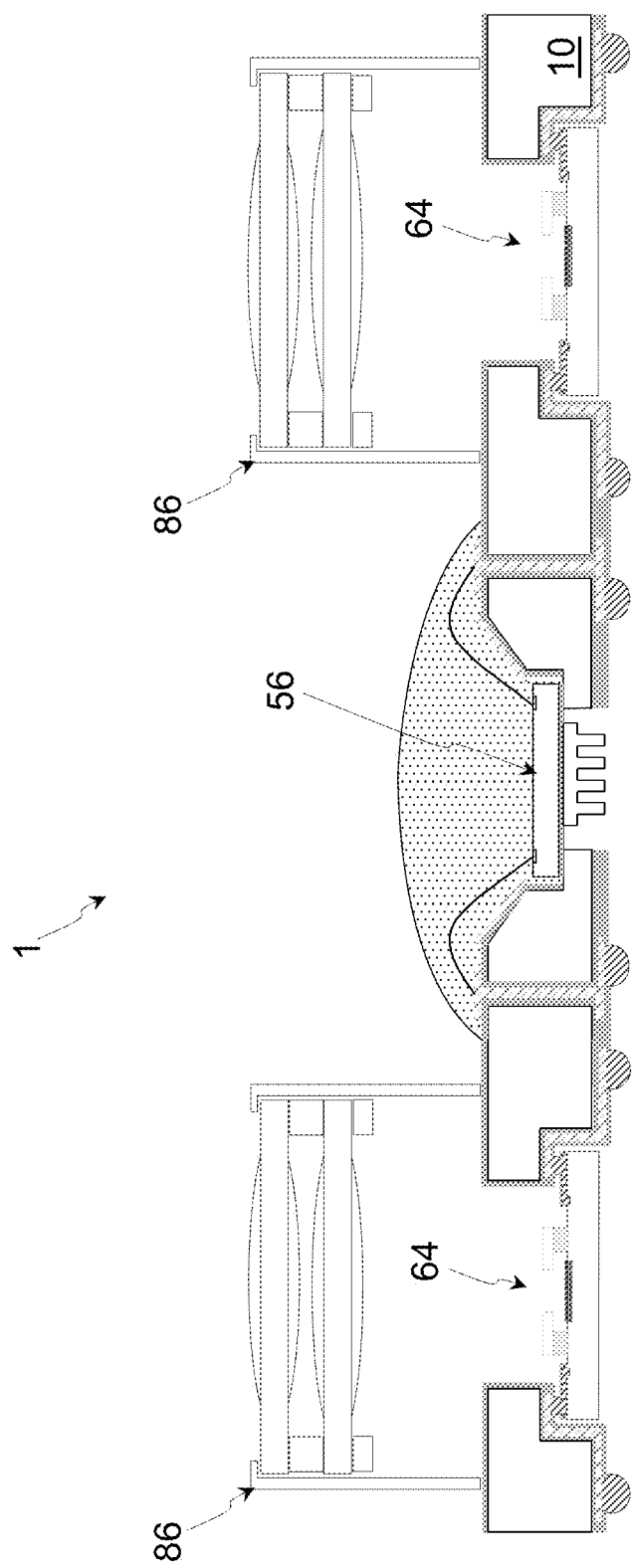
Figures 16, 17:
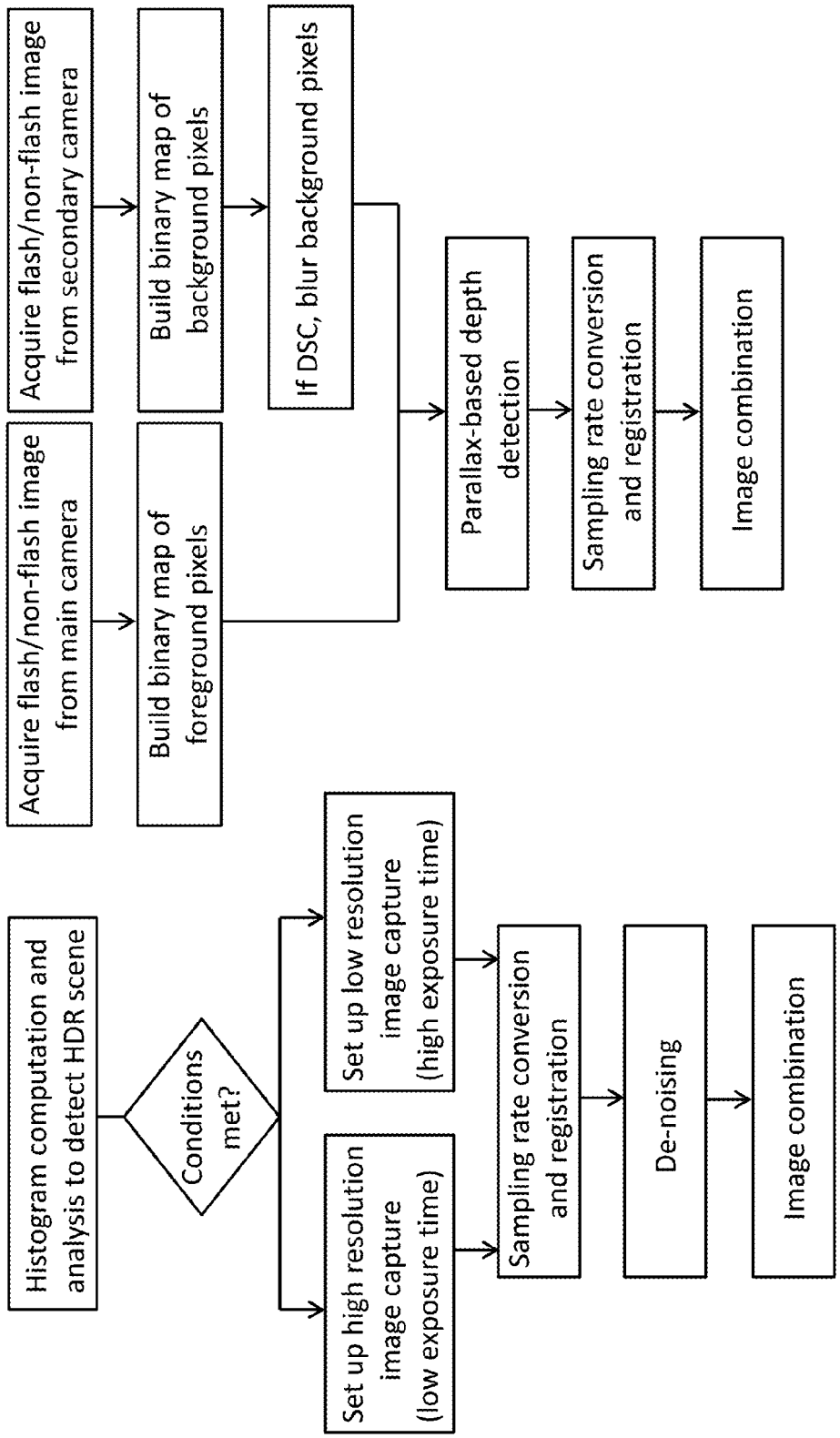
FIG. 16 is a flow chart illustrating the steps for processing and combining different images (one low resolution, one high resolution) from two image sensors to form a higher quality final image.
FIG. 17 is a flow chart illustrates the steps for processing and combining different images from two image sensors to form a three dimensional final image.

FIG. 15H shows the LED die 56 disposed between two CMOS sensor packages 64 on the same substrate 10. The two CMOS sensors 64 could have one or more different optical sensing characteristics (e.g. different imaging resolutions (such as different pixel numbers, different pixel sizes, different active area sizes, and/or lens modules 86 of different lens focusing characteristic(s), etc.), different spectral properties (such as varying sensitivities to different wavelengths or wavelength ranges), etc., whereby together the two optical sensors provide greater imaging capabilities than just a single image sensor. For example, the two optical sensors can be used to provide higher single image quality, or could be used to create three dimensional images. FIG. 16 illustrates one exemplary technique for processing and combining different images (one low resolution, one high resolution) from two image sensors to form a higher quality final image. FIG. 17 illustrates another exemplary technique for processing and combining different images from two image sensors to form a three dimensional final image.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the camera module of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" or "on a substrate" can include forming the element directly on the substrate with no intermediate materials/elements therebetween, as well as forming the element indirectly on the substrate with one or more intermediate materials/elements therebetween.

What is claimed is:

1. A camera module, comprising:
   a substrate of conductive silicon having top and bottom surfaces, the substrate comprising:
      a first cavity formed into the bottom surface of the substrate and having an upper surface,
      an aperture extending from the first cavity upper surface to the top surface of the substrate, and
      a second cavity formed into the top surface of the substrate and having a lower surface;
   a sensor device that includes at least one photodetector, is disposed at least partially in the first cavity, and is mounted to the first cavity upper surface; and
   an LED device that includes at least one light emitting diode, is disposed at least partially in the second cavity, and is mounted to the second cavity lower surface.

2. The camera module of claim 1, wherein the substrate further comprises:
   a first plurality of conductive leads each electrically connected to the sensor device and including a contact pad on the bottom surface of the substrate; and
   a second plurality of conductive leads extending through and insulated from the substrate, each of the second plurality of conductive leads extending between a first contact pad at the top surface and a second contact pad at the bottom surface.

3. The camera module of claim 2, wherein each of the first plurality of conductive leads extends over and is insulated from the upper surface of the first cavity, a sidewall of the first cavity, and the bottom surface of the substrate.

4. The camera module of claim 2, further comprising:
   a first plurality of electrical interconnects each electrically connected to one of the contact pads of the first plurality of conductive leads; and
   a second plurality of electrical interconnects each electrically connected to one of the second contact pads of the second plurality of conductive leads.

5. The camera module of claim 2, further comprising:
   a plurality of wires each electrically connected between the LED device and one of the first contact pads.

6. The camera module of claim 5, further comprising:
   encapsulant material formed in the second cavity, over the LED device, over the plurality of wires and over at least a portion of the top surface of the substrate.

7. The camera module of claim 5, further comprising:
   a curved member mounted to the top surface and disposed over the second cavity, the LED device, and the plurality of wires.

8. The camera module of claim 1, wherein the at least one photodetector is oriented to receive light passing through the aperture, and wherein the at least one light emitting diode is disposed in the second cavity and facing an opening of the second cavity at the top surface of the substrate.

9. The camera module of claim 1, further comprising:
   a lens module that includes:
      a housing mounted to the top surface and over the aperture;
      at least one lens secured in the housing and disposed to focus light impinging on the top surface through the aperture and onto the at least one photodetector.

10. The camera module of claim 1, wherein a sidewall of the second cavity is tapered and covered with a reflective material.

11. The camera module of claim 1, wherein the substrate further comprises:
    a third cavity extending from the bottom surface of the substrate to the lower surface of the second cavity.

12. The camera module of claim 11, further comprising:
    a heat sink disposed in the third cavity and mounted to the LED device.

13. The camera module of claim 11, further comprising:
    a logic device disposed in the third cavity;
    wherein the substrate further comprises:
       a third plurality of conductive leads each electrically connected to the logic device and including a contact pad on the bottom surface of the substrate, wherein each of the third plurality of conductive leads extends over and is insulated from a sidewall of the third cavity and the bottom surface of the substrate.

14. The camera module of claim 13, further comprising:
    a heat sink mounted to the logic device.

15. The camera module of claim 1, wherein:
    the substrate further comprises:
       a third cavity formed into the bottom surface of the substrate and having an upper surface, and
       a second aperture extending from the third cavity upper surface to the top surface of the substrate;
    the camera module further comprises:
       a second sensor device that includes at least one photodetector, is disposed at least partially in the third cavity, and is mounted to the third cavity upper surface.

16. The camera module of claim 15, wherein the sensor device has a different optical sensing characteristic than that of the second sensor device.

17. The camera module of claim 15, further comprising:
    a first lens module that includes:
       a housing mounted to the top surface and over the aperture;
       at least one lens secured in the housing and disposed to focus light impinging on the top surface through the aperture and onto the at least one photodetector of the sensor device;
    a second lens module that includes:
       a second housing mounted to the top surface and over the second aperture;
       at least one second lens secured in the housing and disposed to focus light impinging on the top surface through the second aperture and onto the at least one photodetector of the second sensor device;
    wherein the first lens module has at least one focusing characteristic that is different than that of the second lens module.

18. A method of forming a camera module, comprising:
    providing a substrate of conductive silicon having top and bottom surfaces;
    forming a first cavity into the bottom surface of the substrate, the first cavity having an upper surface;
    forming an aperture extending from the first cavity upper surface to the top surface of the substrate;
    forming a second cavity into the top surface of the substrate, the second cavity having a lower surface;
    mounting a sensor device to the first cavity upper surface, wherein the sensor device includes at least one photodetector; and
    mounting an LED device to the second cavity lower surface, wherein the LED device includes at least one light emitting diode.

19. The method of claim 18, further comprising:
    forming a first plurality of conductive leads each electrically connected to the sensor device and including a contact pad on the bottom surface of the substrate; and
    forming a second plurality of conductive leads extending through and insulated from the substrate, wherein each of the second plurality of conductive leads extends between a first contact pad at the top surface and a second contact pad at the bottom surface.

20. The method of claim 19, wherein each of the first plurality of conductive leads extends over and is insulated from the upper surface of the first cavity, a sidewall of the first cavity, and the bottom surface of the substrate.

21. The method of claim 19, further comprising:
forming a first plurality of electrical interconnects each electrically connected to one of the contact pads of the first plurality of conductive leads; and
forming a second plurality of electrical interconnects each electrically connected to one of the second contact pads of the second plurality of conductive leads.

22. The method of claim 19, further comprising:
connecting a plurality of wires between the LED device and the first contact pads.

23. The method of claim 22, further comprising:
forming encapsulant material that is disposed in the second cavity, over the LED device, over the plurality of wires and over at least a portion of the top surface of the substrate.

24. The method of claim 22, further comprising:
mounting a curved member to the top surface, wherein the curved member is disposed over the second cavity, the LED device, and the plurality of wires.

25. The method of claim 18, wherein the at least one photodetector is oriented to receive light passing through the aperture, and wherein the at least one light emitting diode is disposed in the second cavity and facing an opening of the second cavity at the top surface of the substrate.

26. The method of claim 18, further comprising:
mounting a lens module to the top surface and over the aperture, wherein the lens module includes at least one lens disposed to focus light impinging on the top surface of the substrate through the aperture and onto the at least one photodetector.

27. The method of claim 18, wherein the forming of the second cavity comprises:
forming a sidewall of the second cavity which is tapered; and
covering the tapered sidewall of the second cavity with a reflective material.

28. The method of claim 18, further comprising:
forming a third cavity in the substrate that extends from the bottom surface of the substrate to the lower surface of the second cavity.

29. The method of claim 28, further comprising:
mounting a heat sink to the LED device, wherein the heat sink is disposed in the third cavity.

30. The method of claim 18, further comprising:
mounting a logic device in the third cavity; and
forming a third plurality of conductive leads each electrically connected to the logic device and including a contact pad on the bottom surface of the substrate, wherein each of the third plurality of conductive leads extends over and is insulated from a sidewall of the third cavity and the bottom surface of the substrate.

31. The method of claim 30, further comprising:
mounting a heat sink to the logic device.

32. The method of claim 18, further comprising:
forming a third cavity into the bottom surface of the substrate, the third cavity having an upper surface;
forming a second aperture extending from the third cavity upper surface to the top surface of the substrate; and
mounting a second sensor device to the third cavity upper surface, wherein the second sensor device includes at least one photodetector.

33. The method of claim 32, wherein the sensor device has a different optical sensing characteristic than that of the second sensor device.

34. The method of claim 32, further comprising:
mounting a first lens module to the top surface and over the aperture, wherein the first lens module includes at least one lens disposed to focus light impinging on the top surface of the substrate through the aperture and onto the at least one photodetector of the first lens module; and
mounting a second lens module to the top surface and over the second aperture, wherein the second lens module includes at least one second lens disposed to focus light impinging on the top surface of the substrate through the second aperture and onto the at least one photodetector of the second lens module;
wherein the first lens module has at least one focusing characteristic that is different than that of the second lens module.

* * * * *